(12) United States Patent
Valmonte et al.

(10) Patent No.: US 11,994,564 B2
(45) Date of Patent: May 28, 2024

(54) POWER SUPPLY COMMUNICATION ARCHITECTURE WITH DIAGNOSTICS, ANALYTICS, AND REMOTE CONFIGURATION FOR ENHANCED OPERATION AND MAINTENANCE

(71) Applicant: Appleton Grp LLC, Rosemont, IL (US)

(72) Inventors: Neil Jingo Samson Valmonte, Mandaluyong (PH); Ravindra Gurjar, Pune (IN); Ajay Tripathi, Libertyville, IL (US); Patrick Murphy, Deerfield, IL (US); Calvin Burnett, Bartlett, TN (US); Earl Max Cambronero, Laguna (PH)

(73) Assignee: Appleton Grp LLC, Rosemont, IL (US)

( * ) Notice: Subject to any disclaimer, the term of this patent is extended or adjusted under 35 U.S.C. 154(b) by 4 days.

(21) Appl. No.: 17/711,333

(22) Filed: Apr. 1, 2022

(65) Prior Publication Data

US 2023/0228823 A1     Jul. 20, 2023

(30) Foreign Application Priority Data

Jan. 14, 2022     (IN) .............................. 202221002301

(51) Int. Cl.
*G06F 1/00*     (2006.01)
*G01R 31/40*     (2020.01)
(Continued)

(52) U.S. Cl.
CPC ............... *G01R 31/40* (2013.01); *G06F 1/28* (2013.01); *G08B 21/18* (2013.01); *H04L 67/12* (2013.01)

(58) Field of Classification Search
CPC .................................. G01R 31/40; G06F 1/28
See application file for complete search history.

(56) References Cited

U.S. PATENT DOCUMENTS 5,796,185 A      8/1998   Takata et al.
6,815,640 B1    11/2004   Spear et al.
(Continued)

OTHER PUBLICATIONS

Viviano Anthony: "How to Isolate Signal and Power for I 2 C", May 1, 2021 (May 1, 2021), pp. 1-3, XP093033288, Retrieved from the Internet: URL:https://www.ti.com/lit/an/slla417b/slla417b.pdf?ts=1679314172362&ref_url=https%3A%2F%2Fwww.google.com%2F [retrieved on Mar. 21, 2023].

(Continued)

*Primary Examiner* — Mohammed H Rehman
(74) *Attorney, Agent, or Firm* — McDonnell Boehnen Hulbert & Berghoff LLP

(57) ABSTRACT

A system is described. The system includes at least one power supply, a control system communicatively coupled to the at least one power supply, a communication module, and at least one channel connecting the at least one power supply to the communication module. The at least one channel is also configured to support communication according to a particular communication protocol. The communication module is configured to interface with two or more power supplies of the at least one power supply via the at least one channel, and each power supply of the at least one power supply is configured to transmit diagnostic data associated with the power supply to the communication module via the at least one channel.

19 Claims, 7 Drawing Sheets

(51) Int. Cl.
 *G06F 1/28* (2006.01)
 *G08B 21/18* (2006.01)
 *H04L 67/12* (2022.01)

(56) References Cited

U.S. PATENT DOCUMENTS

| | | | |
|---|---|---|---|
| 7,703,046 | B2 | 4/2010 | Fallon et al. |
| 7,783,924 | B2 | 8/2010 | Zaman et al. |
| 9,667,060 | B1* | 5/2017 | Sizikov .................. H02H 3/006 |
| 10,213,861 | B2 | 2/2019 | Stoner et al. |
| 10,417,071 | B2 | 9/2019 | Fukuda et al. |
| 10,962,959 | B2 | 3/2021 | Kitamura et al. |
| 11,093,013 | B2* | 8/2021 | Yam .................... H04L 43/0817 |
| 2002/0091887 | A1 | 7/2002 | Reay et al. |
| 2006/0143583 | A1* | 6/2006 | Diab ..................... G06F 1/3209 |
| | | | 713/300 |
| 2010/0308243 | A1* | 12/2010 | Bedingfield ........ F16K 31/0672 |
| | | | 251/129.15 |
| 2013/0134942 | A1* | 5/2013 | Sakurai ................ H02J 7/0047 |
| | | | 320/118 |
| 2013/0275783 | A1* | 10/2013 | Liu ........................ G06F 11/00 |
| | | | 307/66 |
| 2013/0332762 | A1* | 12/2013 | Meirosu .............. H04L 41/0816 |
| | | | 713/323 |
| 2015/0115711 | A1 | 4/2015 | Kouroussis et al. |
| 2018/0239310 | A1 | 8/2018 | Liu et al. |
| 2018/0351359 | A1* | 12/2018 | Abe .......................... H02J 1/06 |
| 2019/0176726 | A1* | 6/2019 | Kanno ................ B60R 16/0231 |
| 2020/0310480 | A1 | 10/2020 | Rooyakkers et al. |
| 2023/0266816 | A1* | 8/2023 | Chonan ................. G06F 1/3296 |
| | | | 713/320 |

OTHER PUBLICATIONS

Extended European Search Report for European Application No. 22173624.2, mailed Mar. 28, 2023.
Partial European Search Report for EP Application No. 22173624.2, dated Nov. 7, 2022.
The Heart of Automation, SITOP Power Supply, Siemens, Mar. 2022 Edition.

\* cited by examiner

POWER SUPPLY COMMUNICATION ARCHITECTURE WITH DIAGNOSTICS, ANALYTICS, AND REMOTE CONFIGURATION FOR ENHANCED OPERATION AND MAINTENANCE

BACKGROUND OF THE INVENTION

The reliable functioning and ease of maintenance of power supplies can be critical, such as in maintaining the smooth operation of industrial facilities such as power, oil, and gas processing, wastewater and discrete manufacturing. Power supplies perform a critical role in providing clean, safe, and reliable DC power to distributed control systems (DCS), and programmable logic controllers (PLC) operating the facilities. The unsuspected damage, malfunction or normal expiration of power supplies can unintentionally disable the control systems resulting in unplanned shutdown and the subsequent loss of operation and output, as well as financial losses.

The typical way of mitigating loss of power is use of redundant system which involves two or more power supplies and redundancy modules. For example, in an implementation with two power supplies, if one of the two power supplies fail, the lone remaining power supply can still continue the uninterrupted operation of the system. And a redundancy module can isolate the damaged power supply from the working system.

However, various problems can arise with such a system. For example, at least one of such power supplies can consume space inside a control cabinet, much of which is needed to accommodate sensors and control devices to meet the ongoing digital transformation of industrial facilities. In addition, if one supply fails, relying on less power supplies, and especially relying on only one power supply, can pose an increased risk of a plant shutdown. Thereafter, an unplanned maintenance action can be required to replace the faulty supply. In sum, downtime can exceed what is desired. Furthermore, existing systems typically do not provide a way of understanding the root cause of a failure of one of the power supplies, and existing systems might not be equipped to provide information to facilitate this understanding. For instance, the reliable operation of a power supply can typically be determined by a number of factors, such as a stable energy source, the non-existence of overloads, and the power supply operating within its rated ambient temperature, but existing systems might not have a way to efficiently provide such information, and thus might not give users insights on how to improve the overall reliability of their power source.

SUMMARY

To address at least the aforementioned operational issues with existing power supply systems, the present disclosure relates to power supply communication architecture for enhanced operation and maintenance.

In one aspect, a system is described. The system includes at least one power supply. The system also includes a control system communicatively coupled to the at least one power supply. The system also includes a communication module. The system also includes at least one channel connecting the at least one power supply to the communication module and configured to support communication according to a particular communication protocol. The communication module is configured to interface with two or more power supplies of the at least one power supply via the at least one channel. Each power supply of the at least one power supply is configured to transmit diagnostic data associated with the power supply to the communication module via the at least one channel.

In another aspect, a system is described. The system includes a plurality of power supplies. The system also includes a control system communicatively coupled to the plurality of power supplies. The system also includes a communication module. The system also includes at least one inter-integrated circuit (I2C) channel connecting the plurality of power supplies to the communication module. The communication module is configured to interface with two or more power supplies of the plurality of power supplies via the at least one I2C channel. Each power supply of the plurality of power supplies is configured to transmit diagnostic data associated with the power supply to the communication module via the at least one I2C channel. The diagnostic data includes two or more of live parameters, event flags, event counts, minimum and maximum parameters, and expected service life data.

In another aspect, a method is described. The method includes receiving, by a processor of a communication module, from each of a plurality of power supplies, and over a plurality of channels connecting the plurality of power supplies to the communication module, diagnostic data determined by a processor of the power supply based on sensor data from sensors of the power supply, the diagnostic data comprising (i) live parameters of the power supply, (ii) event flags indicative of one or more parameters of the power supply being out of a predefined range, (iii) an event count, (iv) minimum and maximum parameter values, and (v) expected service life data. The method also includes controlling, by the processor of the communication module, each of the plurality of power supplies to store at least a portion of the diagnostic data in a respective non-volatile storage component of the power supply. The method also includes generating and displaying, by the processor of the communication module and via a display device of the communication module, one or more graphical user interfaces that include a visual indication of the diagnostic data and further include a selectable element that, when selected, enables a user of the communication module to change one or more operational settings of at least one of the plurality of power supplies.

These, as well as other aspects, advantages, and alternatives, will become apparent to those of ordinary skill in the art by reading the following detailed description, with reference where appropriate to the accompanying drawings.

DETAILED DESCRIPTION

Example methods and systems are described herein. The words "example," "exemplary," and "illustrative" are used herein to mean "serving as an example, instance, or illustration." Any embodiment or feature described herein as being an "example," being "exemplary," or being "illustrative" is not necessarily to be construed as preferred or advantageous over other embodiments or features. The example embodiments described herein are not meant to be limiting. It will be readily understood that the aspects of the present disclosure, as generally described herein, and illustrated in the figures, can be arranged, substituted, combined, separated, and designed in a wide variety of different configurations, all of which are explicitly contemplated herein.

The following description relates to power supply communication architecture for enhanced operation and maintenance. More particularly, disclosed herein is a system that equips power supplies to provide diagnostic data such as remaining service life, power supply voltage, load power, temperature, and historical data. A communication module of the system can be configured to receive such diagnostic data from the power supplies over at least one channel and use that diagnostic data to take a particular action, such as alerting other devices to take action based on the diagnostic data.

Reference will now be made in detail to various embodiments, examples of which are illustrated in the accompanying drawings. In the following detailed description, numerous specific details are set forth in order to provide a thorough understanding of the present disclosure and the described embodiments. However, the present disclosure may be practiced without these specific details. In other instances, well-known methods, procedures, and components, and circuits have not been described in detail so as not to unnecessarily obscure aspects of the embodiments.

Figure 1:
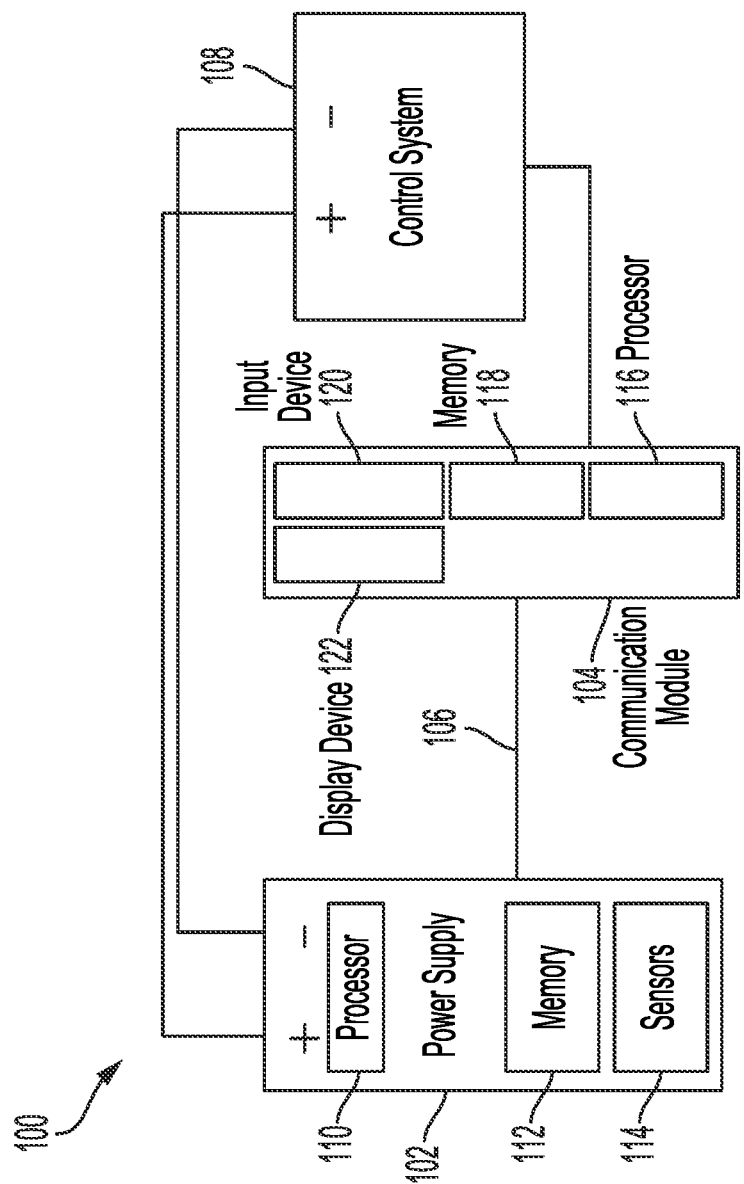
FIG. 1 depicts a system, according to an example implementation.

FIG. 1 depicts a system 100, according to an example implementation. The system 100 includes a power supply 102, a communication module 104, a channel 106 connecting the power supply 102 to the communication module 104, and a control system 108 that is communicatively coupled to the power supply 102.

As shown, the power supply 102 includes a processor 110, memory 112, and sensors 114. The power supply 102 can include other components as well, such as light-emitting diodes (LEDs), switches, magnetics, resistors, capacitors, heatsinks, insulators, chassis, and/or printed circuit boards (PCBs), among other possible components.

The processor 110 can be a general-purpose processor or special purpose processor (e.g., a digital signal processor, application specific integrated circuit, etc.). The processor 110 can be configured to execute instructions (e.g., computer-readable program instructions including computer executable code) (not shown) that are stored in the memory 112 and are executable to perform various operations described herein. As an example, such operations can include receiving diagnostic data from the sensors 114, recording the diagnostic data in the memory 112, and transmitting the diagnostic data to the communication module 104 via the channel 106. The diagnostic data can be or include a variety of diagnostic data that is associated with the power supply 102, such as live parameters (e.g., voltage, current, status of one or more LEDs, power supply internal temperature, and type of input (i.e., AC or DC), event flags, event counts, minimum and maximum parameter values, expected remaining service life data, and/or timestamps associated with the aforementioned information, among other possible information. More detailed examples of such data is discussed later herein.

The memory 112 can take the form of one or more computer-readable storage media that can be read or accessed by the processor 110. The computer-readable storage media can include volatile memory and/or non-volatile memory (referred to hereinafter as volatile or non-volatile storage components), such as register memory, Random Access Memory (RAM), read-only memory (ROM) (e.g., electronically erasable programmable read-only memory (EEPROM)), optical, magnetic, organic or other memory or disc storage, which can be integrated in whole or in part with the processor 110.

The sensors 114 can be or include any sensors that are configured to monitor for at least a portion of the diagnostic data (e.g., the live parameters) described herein, such as one or more temperature sensors, one or more current sensors, and one or more voltage sensors.

The channel 106 is a configured to support communication according to a particular communication protocol, such as an inter-integrated circuit (I2C) protocol, a universal asynchronous receiver-transmitter (UART) protocol, or a serial peripheral interface (SPI) protocol. Other example protocols are possible as well.

The communication module 104 can take the form of a hardware assembly that includes a processor 116, memory 118, an input device 120, and a display device 122. Within examples, the processor 116 and memory 118 can be part of a microcontroller. Further, the processor 116 can take the same or different form as the processor 110 described above, and the memory 118 can take the same or different form as the memory 112 described above. For example, the memory 118 and the memory 112 can have different storage capacities or storage components.

The input device 120 can take the form of a device configured to receive user input, such as a keyboard, microphone, or touchscreen.

The display device 122 can be integrated with the input device 120 or can be separate from the input device 120, and can take the form of a device configured to display information to a user, such as a computer monitor or touchscreen.

The processor 116 of the communication module 104 can be configured to execute instructions (not shown) that are stored in the memory 118 and are executable to perform various operations described herein. As an example, such operations can include (i) generating and transmitting a request to the power supply 102 or other connected power supplies to send the diagnostic data to the communication module 104, (ii) receiving the diagnostic data (e.g., in the form of I2C data, in situations where the channel 106 is an I2C channel) in response to the request, (iii) converting the diagnostic data received from the power supply 102 to other communication protocols, such as one or more other industrial communication protocols, (iv) storing the converted diagnostic data, (v) hosting and outputting, via the display device 122, a graphical user interface (GUI) (e.g., an embedded webserver GUI in the communication module 104) that the user can use to view visual indications of at least a portion of the diagnostic data and make changes to settings of the power supply 102 or other connected power supplies, and (vi) transmitting the diagnostic data to the control system 108. Additionally or alternatively, the communication module 104 can provide access to the diagnostic data via a user interface of asset management software running in the control system 108 (not shown). Other example operations are possible as well.

The communication module 104 can be configured with read and write access to the memory 112 of the power supply 102, as well as read and write access to any other power supply that is part of the system 100. As will be discussed in more detail later herein, the communication module 104 can use this functionality to cause the power supply 102 to store at least a portion of the diagnostic data, as well as to access the diagnostic data and provide it for display via display device 122.

Furthermore, within examples, the communication module 104 can also include a memory card slot (e.g., a Secure Digital (SD) card slot) configured to receive an external storage device and expend the memory 118 of the communication module 104.

Within further examples, the communication module 104 can be configured to support a variety of different protocols, depending on different user/customer requirements. For instance, the communication module 104 can be configured to support oil, gas, power, and/or other industries via an industrial communication protocol such as the Highway Addressable Remote Transducer (HART) protocol. In alternative examples, the communication module 104 can be configured to support discrete manufacturing facilities or other facilities via Ethernet-based protocols, such as Ethernet/IP, Modbus® Transmission Control Protocol (TCP), Profinet®. Through firmware design for the Ethernet-based protocols, the communication module 104 can be used to address a desired industrial protocol. Other examples are possible as well.

In alternative implementations, the communication module 104 can be integrated within the power supply 102.

The control system 108 can be or include a distributed control system (DCS) or a programmable logic controller (PLC), for instance, can be powered by the power supply 102 and/or other power supplies, and can be in direct or indirect communication with at least the communication module 104. The control system 108 could take the form of a mobile handheld computing system, in some examples, or could take other forms. The control system 108 can be configured to support multiple different communication protocols, including but not limited to those described above. Further, the control system 108 can be configured to receive the diagnostic data from the communication module 104 and responsively perform a particular action, such as alerting other devices to take action based on operating conditions of the power supply 102 and/or other power supplies.

Figure 2:
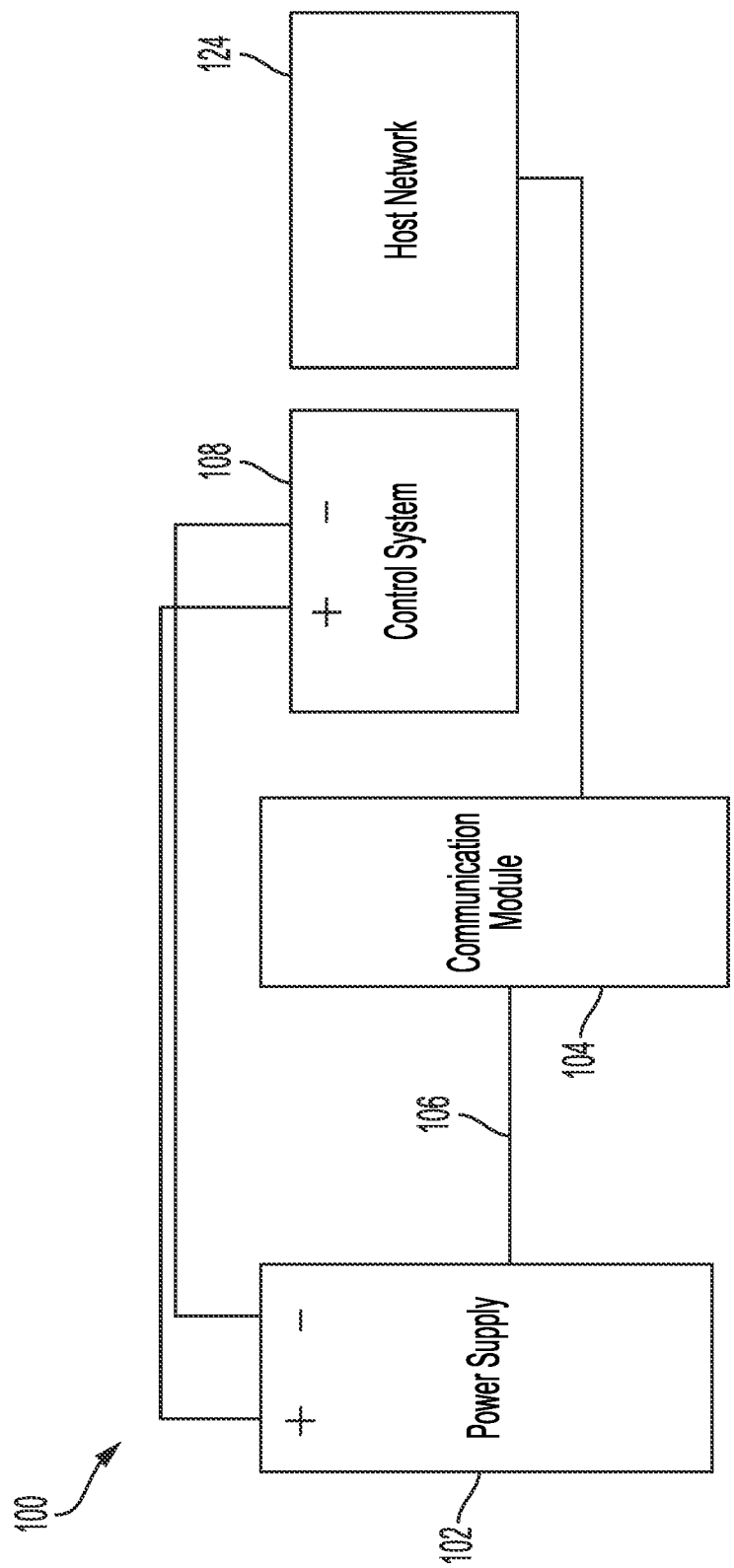
FIG. 2 depicts the system of FIG. 1 having a connection to a host network, according to an example implementation.

FIG. 2 depicts an example implementation of the system 100 in which the system 100 has a connection to a host network 124. The connection can be a wired or wireless connection. The communication module 104 can be configured to interface with the host network 124 over in accordance with one or more communication protocols, such as Ethernet-based protocols, as an alternative to directly interfacing with the control system 108. As such, the host network 124 can receive information such as the diagnostic data from the communication module 104 and then transmit such data, or instructions related thereto, to the control system 108. Such an interface with the host network 124 can be advantageous in industrial facilities in which there is an existing Ethernet network.

Within examples, a user can use the display device 122 (not shown in FIG. 2) and input device 120 (not shown in FIG. 2) of the communication module 104 to view the diagnostic data before it is sent to the control system 108, and perhaps input an instruction for the communication module 104 to send the diagnostic data to the control system 108 or host network 124. This can help the user ensure that the diagnostic data that is being transmitted is as-expected.

Although other power supplies are not explicitly shown in FIGS. 1 and 2, it should be understood that the system 100 can include additional power supplies, each being configured in the same or similar way as power supply 102 and connected to the communication module 104 via a respective channel that is configured the same as channel 106. Further, regardless of how many power supplies are connected to the communication module 104, the communication module 104 described herein can be configured to interface with two or more such power supplies over the respective channels, such as in the manners described above and/or as discussed later herein. For example, the communication module 104 can be configured to interface with up to 32 power supplies over I2C channels. Other examples are possible as well.

Figure 3:
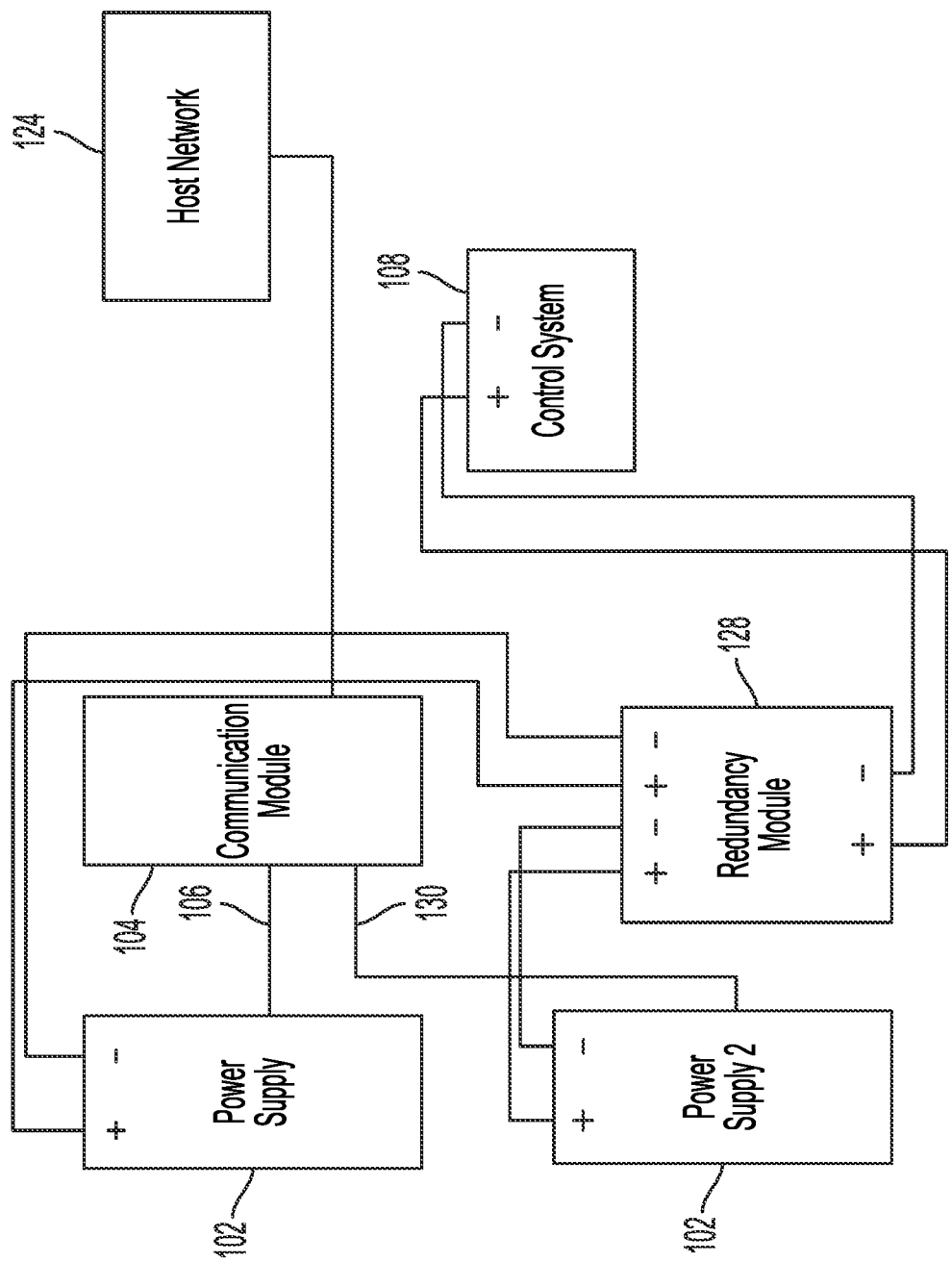
FIG. 3 depicts the system of FIG. 1 having a redundancy module and a connection to a host network, according to an example implementation.

FIG. 3 depicts an example implementation of the system 100 in which the system 100 includes two power supplies 102, 126, as well as a redundancy module 128 that is connected between the control system 108 and the power supplies 102, 126. The system 100 shown in FIG. 3 also has a connection to the host network 124. Each of power supply 102 and power supply 126 is connected to the communication module 104 via a respective channel—namely, channel 106 and channel 130, respectively. Channel 130 can be configured to facilitate communication between power supply 126 and the communication module 104 in accordance with the same communication protocol as channel 106 (e.g., I2C). The redundancy module 128 can be configured to isolate power supply 102 or power supply 126 from a remainder of the system 100 in the event that such a power supply is damaged, so that the remaining power supply can continue uninterrupted operation.

Within examples, the power supplies 102, 126 can be configured to energize the same load, but are also capable of energizing different loads. Further, even though the communication module 104 is shown to have a connection to the host network 124, the communication module 104 can directly interface with the control system 108 in alternative implementations.

Additional advantageous features of the system 100 will now be described in more detail. In line with the discussion above, the diagnostic data provided by each power supply of the system 100 (e.g., power supply 102, which will be treated as representative of power supplies of the system 100) can help ensure reliable operation and maintenance of such power suppl(ies).

Each type of diagnostic data described herein can be temporarily stored in a volatile storage component of memory 112 during live operation of the system 100. However, diagnostic data that is temporarily stored in the volatile storage component of memory 112 can be lost upon shutdown of the power supply 102. As will be discussed below, at least a portion of the diagnostic data described herein can be stored in a non-volatile storage component of memory 112 and/or in a non-volatile storage component of memory 118 of the communication module 104 so that it is not lost upon shutdown.

One example type of the diagnostic data is live parameters. The capability of the processor 110 of the power supply 102 to monitor and provide its live parameters can usefully give a user real-time information as to the operating condition of the power supply 102, as well as event information associated therewith. As noted above, examples of such live parameters include voltage in, voltage out, current in, current out, status of one or more LEDs, power supply internal temperature, type of input (i.e., AC or DC). In some cases, the live parameters can also include an ambient temperature of the communication module 104, which can be monitored by the sensors 114 of the power supply 102 and provided for display via the communication module 104 because such ambient temperature might not be influenced by heat dissipated by a power supply. In other cases, the communication module 104 itself can be equipped with sensors (not shown) used to monitor ambient temperature. As the live parameters are being monitored in real time, the power supply 102 can store the live parameters in a volatile storage component of memory 112. As such, upon shutdown of the power supply 102, the live parameters are lost.

The diagnostic data can also include event flags. Event flags can be indicative of one or more parameters of the power supply 102 being out of a predefined range (e.g., a normal range that is expected or desired), and can thereby be indicative of existing disruption or possible upcoming disruption of the operation of the system 100. The one or more parameters associated with such event flags can include one or more electrical characteristics of the power supply 102, such as current or voltage. Additionally or alternatively, the one or more parameters can include one or more temperature characteristics of the power supply 102, such as an internal temperature of the power supply 102. Further, in some cases, an event flag can be determined and stored if a connection between the power supply 102 and one or more other components of the system 100 is severed or otherwise lost. As the sensors 114 of the power supply 102 monitor the one or more parameters, the processor 110 can detect when any given parameter is out of a corresponding predefined range for that parameter and responsively store an event flag.

Event flags are similar to live parameters in that they are also typically stored in a volatile storage component of memory 112 and then lost if the power supply 102 is shut down. Memory limitations of the power supply 102 can prevent the power supply 102 from storing the event flags on its own. However, provided that the power supply 102 is connected to the communication module 104, the power supply 102 can be configured to send the event flags to the communication module 104, which in turn is configured to timestamp the received event flags and store the event flags in a non-volatile storage component of memory 118 along with the associated timestamps. The communication module 104 can also send the event flags and associated timestamps back to the power supply 102 for the power supply 102 to then store in a non-volatile storage component of memory 112. Having the communication module 104 timestamp the event flags in real time instead of the power supply 102 can avoid any unnecessary burden on the processor 110 of the power supply 102, although in alternative implementations, the processor 110 of the power supply 102 can timestamp the event flags, such as in scenarios where there is sufficient memory available to processor 110 to store the event flags in real time.

Within examples, the communication module 104 can be configured to store event flags and timestamps in the non-volatile component of the memory 112 of the power supply 102 in response to the communication module 104 determining that one or more conditions have been met. As an example condition, the communication module 104 can store such diagnostic data in the non-volatile component of the memory 112 of the power supply 102 in response to a determination that the power supply 102 is shutting down. In some cases, the communication module 104 can be configured to store the event flags and timestamps in the non-volatile component of the memory 112 of the power supply 102 only in response to a determination that the power supply 102 is shutting down, so as not to avoid disrupting critical operations being performed by the power supply 102 while in normal service. To facilitate this, the power supply 102 can be configured to monitor the input voltage going into the power supply 102 and, once the power supply 102 detects that the input voltage falls below a predefined threshold level, the voltage sensor of the power supply 102 detecting the input voltage level can transmit a signal to the processor 110 that an imminent shutdown will occur. And the processor 110 or the voltage sensor itself can also transmit the same signal to the communication module 104. In other cases, the communication module 104 can be configured to store the event flags and timestamps in the non-volatile component of the memory 112 of the power supply 102 during normal operation as well.

The diagnostic data can also include event counts, which can be another advantageous piece of information that can give a user insight on how to improve the system 100 and avoid unplanned shutdowns. To facilitate this, the power supply 102 can be configured to detect, and store in the non-volatile component of memory 112 information identifying, events that have been captured by the sensors 114. The power supply 102 can also be configured to count (e.g., via a counting algorithm executable by the processor 110) a number of the events that have been captured by the sensors 114. Within examples, such events can include the events described above in relation to event flags—that is, an event in which a parameter of the power supply 102 is out of a corresponding predefined range for that parameter, such as an abnormal voltage, current, or temperature. Within other examples, such events can include a total time that the power supply 102 has been in service, and/or a total number of times that the power supply 102 has been turned on or off. The power supply 102 can store information identifying the type of events as well as the event counts in a non-volatile storage component of memory 112 during shutting down of the power supply 102 to avoid disrupting critical operations being performed by the power supply 102 while in normal service. That is, the power supply 102 can detect that shutdown is occurring and responsively store the event counts in the non-volatile storage component of memory 112. Within examples, the power supply 102 can be configured to do so only in response to a determination that the power supply 102 is shutting down.

The diagnostic data can also include minimum parameter values, maximum parameter values, and associated timestamps at which such minimum and maximum values are recorded. That is, the power supply 102 can be configured to record both the highest and lowest values detected by the sensors 114 for each of the live parameters. This data can be important because it is at these boundary operating conditions that many power supply failures occur. This can also make it easier to understand the root cause of such failures as opposed to speculation during failure analysis.

In addition, the timestamps (e.g., in milliseconds, seconds, minutes, and/or hours) of the times that the maximum and minimum values are logged are also recorded by the processor 110 in the non-volatile storage component of memory 112 of the power supply 102. Alternatively, the timestamps can be recorded by the communication module 104 and sent back to the power supply 102 to be stored. In either case, the power supply 102 can be configured to store the minimum parameter values, maximum parameter values, and associated timestamps in the non-volatile storage component of memory 112 during shutting down of the power supply 102 to avoid disrupting critical operations being performed by the power supply 102 while in normal service. That is, the power supply 102 can detect that shutdown is occurring and responsively store the minimum parameter values, maximum parameter values, and associated timestamps in the non-volatile storage component of memory 112. And within examples, the power supply 102 can be configured to do so only in response to a determination that the power supply 102 is shutting down.

In some implementations, the communication module 104 can be configured to store event flags, minimum parameter values, maximum parameter values, and associated timestamps in chronological order so that they can be easily accessed and viewed. For instance, the communication module 104 can provide, via display device 122, a GUI having a selectable button that, when selected, causes the communication module 104 to download at least a portion of the recorded diagnostic data, such as all recorded event flags and associated timestamps, from the non-volatile storage component of memory 112 of the power supply 102. Alternatively, the communication module 104 can receive a request from the host network 124 to download and display the diagnostic data, or download and send the diagnostic data elsewhere. Sequences of timestamped event flags, for instance, can help users identify trends and give users insight on the long term behavior of the system 100.

In some cases, the non-volatile storage component of memory 112 can be limited and can be configured to store only up to a maximum number of events flags, such as 50 to 80 events (e.g., 64 events). Such storage capacity can be expanded by way of an SD card or another external storage device.

In some implementations, the communication module 104 can include sensors that are similarly configured to at least a portion of the sensors 114 of the power supply 102. As such, the communication module 104 can monitor, store (e.g., in memory 118) its own diagnostic data, including any one or more examples of the types of diagnostic data described above (e.g., event flags related to abnormal voltage, current, or temperature, highest and lowest values of parameters that have occurred in the communication module 104, and various timestamps associated with events). By being able to monitor diagnostic data of the power supplies and communication module 104 of the system 100, additional insight can be gained for use in avoiding anomalous events, unplanned shutdowns, etc.

The communication module 104 might be configured by default to alert a user when certain parameters of the power supply 102 and/or the communication module 104 fall out of an expected range. But in some implementations, the communication module 104 can be configured such that a user can overwrite any default alerts and set new alerts. To facilitate this, the communication module 104 can receive (e.g., via input device 120), user input identifying (i) a portion of the diagnostic data (e.g., supply voltage or current, or temperature), (ii) a threshold, and (iii) an instruction for the communication module 104 to monitor the portion of the diagnostic data relative to the threshold. In situations where the alert is for temperature, the user can also provide a unit of temperature (degrees Celsius or Fahrenheit).

Based on the instruction, the communication module 104 can then output an alert (e.g., via the display device 122 or another output device, such as a speaker) in response to detecting that the portion of the diagnostic data has fallen below, met, or exceeded the threshold, depending on the type of threshold and the type of diagnostic data the threshold relates to. Within examples, such an alert can be an audio alert, visual alert, haptic feedback alert, or a combination thereof. Within other examples, the outputting of the alert can take the form of the communication module 104 transmitting, to the control system 108, a message indicating the alert and what triggered the alert, so that the control system 108 can automatically respond accordingly with a corrective action or other action, or the user can manually respond with such an action.

In embodiments where there are two or more power supplies, the user can set a redundancy alert that the communication module 104 can output in response to the communication module 104 detecting that the sum of the output currents from the power supplies (e.g., a sum of the output currents from power supply 102 and power supply 126) exceeds an individual power supply output rating of either of the power supplies, so as to indicate an out-of-redundancy condition. The control system 108 and/or the user can then respond to the alert by reducing the power supplies' load to bring the system 100 back to redundant operation. For example, consider a situation in which power supply 102 and power supply 126 each have an individual power supply rating of 240 Watts (in which case their redundancy rating is 240 Watts as well) and the total load of the system 100 is 300 Watts. In this case, if one of the power supplies dies out, the other power supply can die out due to electrical overstress or disable itself because the 300 Watts load was greater than the 240 Watts rating of that remaining power supply. Thus, it can be important to inform the user if the total system load greater than the redundancy rating.

Another alert that can be set and output is a "remaining service life low" alert—namely, where the remaining service life has fallen below a particular predefined threshold. In some examples, the remaining service life can be expressed in the form of a percentage, although in other cases, it can be expressed in the form of remaining hours of service, as described in more detail later herein.

In practice, the power supply 102 can calculate its remaining service life based on various factors, such as the internal temperature of the power supply 102, which is directly proportional to the temperature of the electrolytic capacitors of the power supply 102. Alternatively, the communication module 104 can perform the calculation. The power supply 102 and/or the communication module 104 can thus be configured to count down from 100% service life at a rate defined by the factors noted above. As an example calculation, the remaining service life can be represented by Equation 1 below, where k is a decay coefficient for capacitors, T is the capacitor temperature, and R is the current running time of the power supply 102.

$$\text{Remaining service life(in years)} = 15 - k*T*R \quad \text{(Equation 1)}$$

Once the power supply 102 and/or the communication module 104 has detected that the remaining service life has fallen below a particular predefined threshold (e.g., 20%), the communication module 104 can output an alert (or, the power supply 102 can transmit an alert message to the communication module 104, which then in turn outputs the alert) that the power supply 102 needs to be replaced in order to avoid an unplanned shutdown. In some situations, it can be desirable to set the predefined threshold to be higher so as to have more time to respond, thus further improving reliability of the system 100.

In some implementations, the power supply 102 can be configured to calculate and send to the communication module 104 its remaining service life in the form of remaining hours of service, particularly using an electrolytic capacitor life calculation, which is based at least in part on the present thermal condition (e.g., ambient temperature and/or maximum temperature rating) of the capacitor(s). Accordingly, the threshold used to set an alert can be a threshold number of remaining hours of service life, which, when triggered, can indicate to a user and/or the control system 108 that the power supply 102 needs to be replaced. Furthermore, alerts can be set based on critical part stress (e.g., thermal, voltage) to indicate potential for failure mode.

The above-described capabilities to set alerts can enable the user to have the flexibility to accommodate user/customer-specific alert settings, which can help promote optimized performance of the system 100 without sacrificing reliability.

In some implementations, the power supply 102 itself can be configured to perform differently from its original default specification, both electrically and thermally. This can help accommodate user/customer-specific operational settings, and can work in tandem with the configurable alerts capabilities discussed above. To facilitate this, the communication module 104 can receive (e.g., via input device 120 and via the GUI provided by display device 122), user input identifying a first instruction to change one or more operational settings of the at least one power supply. In response to receiving the user input identifying the first instruction, the communication module 104 can transmit a second instruction to the power supply 102 to change the one or more settings. And the power supply 102 can be configured to change the one or more settings in response to receiving the second instruction.

Examples of the one or more settings include over current pending (e.g., a current level at which the power supply 102 detects and sends an alert that the load is increasing but not high enough to cause electrical damage), over current enabled (e.g., a current level at which the power supply 102 is configured to disable itself in order to protect the system 100), over temperature pending (e.g., a temperature at which the power supply 102 outputs a warning that the temperature inside the cabinet is rising but not high enough to cause damage), over temperature enabled (e.g., a temperature at which the power supply 102 shuts itself down to protect the system 100 from damage from thermal overstress), and output voltage. For example, the power supply 102 can have default settings of 12 A for over current pending, 16 A for over current enabled, 60 degrees Celsius for over temperature pending, and 70 degrees Celsius for over temperature enabled, each of which the user can lower to 10 A, 12 A, 40 degrees Celsius, and 50 degrees Celsius, respectively.

The capability to adjust default settings of the power supply 102 can also allow promote safer operations by making the protection circuit of the power supply 102 react faster to unintended faults in the load. In the above-described example, for instance, lowering over current pending setting can warn the user earlier of a pending over current fault. And lowering the over current enabled setting can protect at a lower, safer level the output voltage of the power supply. Further, lowering the over temperature enabled and over temperature pending settings can warns the user and/or control system 108 earlier of a pending over temperature scenario and enable the user and/or control system 108 to take the necessary action to shut down the power supply 102 to prevent a mishap from occurring.

The specific capability to adjust an output voltage setting of the power supply 102 can be particularly advantageous in a paralleling and load sharing scenario. In a typical paralleling and load share scenario, for instance, the load sharing (e.g., for a 20 A load) between two power supplies is maintained at almost 50:50 to prevent unintended current overload to either of the power supplies. There is no means to split the load at a different ratio without rigorous trial and error. But to implement this, there can be various challenges. For one, the 50:50 share can require approximately the same wire length and gauges. And to trim voltage, it may be necessarily to manually adjust the output voltage of the power supplies to evenly match their voltage levels. If the user desires a different loading ratio, such as 70:30 for instance, this can be even more challenging, as it may require multiple voltage and current meters and a steady, precise operator to carefully adjust the output voltages of the power supply.

To address this and also to increase the overall reliability of the system 100, the system 100 can enable management of the thermal stress of the power supplies. This can be done, for instance, when one power supply is adjacent to a hot, dissipative body, or when one power supply is old and the other power supply is new.

Figure 4:
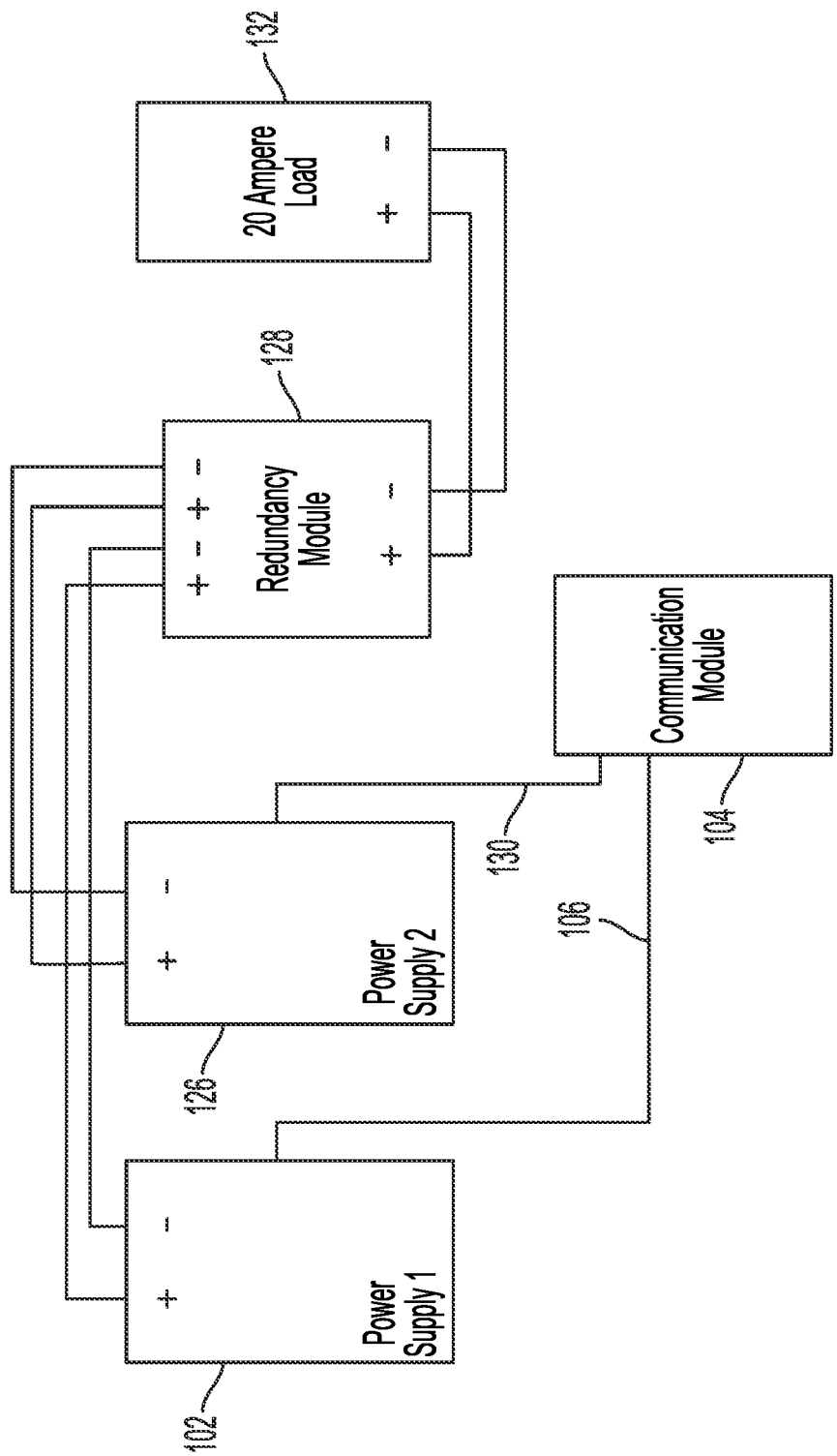
FIG. 4 depicts the system of FIG. 1 supporting remote alteration of output voltage, according to an example implementation.
Figure 5:
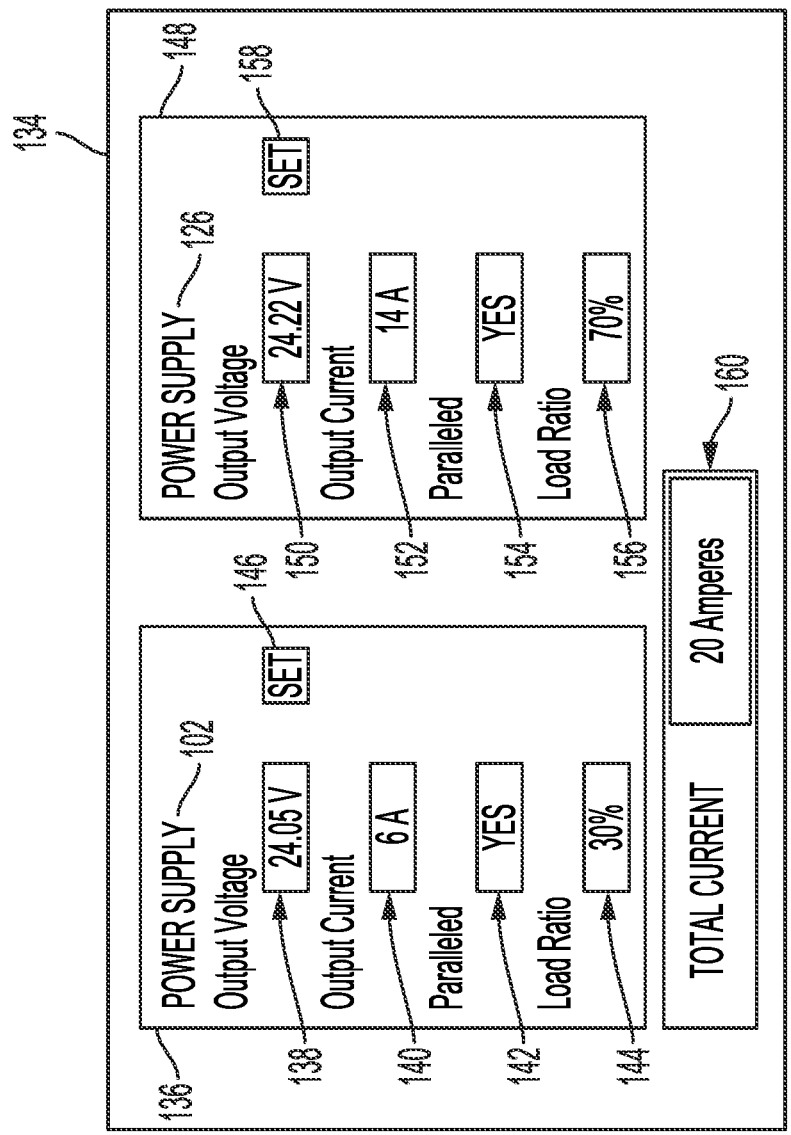
FIG. 5 depicts a graphical user interface for remotely altering output voltage, according to an example implementation.

In particular, FIG. 4 depicts an implementation of the system 100 that supports remote alteration of output voltage via the communication module 104 (e.g., via an embedded webserver GUI of the communication module 104). In addition to the output voltage, this implementation of the system 100 can also monitor and display the shared current and total load current. In the example of FIG. 4 and FIG. 5, for instance, the total load current 132 is 20 A.

FIG. 5 depicts a GUI 134 for remotely altering output voltage, according to an example implementation. As shown, the GUI 134 includes a first region 136 in which various settings of power supply 102 are displayed. For example, within the first region 136, the GUI 134 generated by the communication module 104 includes a first sub-region 138 in which the output voltage of the power supply 102 is displayed, particularly with a value up to two decimal values. The first region 136 also includes a second sub-region 140 in which the output current of the power supply 102 is displayed, a third sub-region 142 in which an indication of whether the power supply 102 is currently paralleled is displayed, and a fourth sub-region 144 in which the load ratio for the power supply 102 is displayed. The first region 136 also includes a selectable GUI element 146 that, when selected by the user, triggers the GUI 134 to enable the user to manually adjust the output voltage of the power supply 102 up to two decimal values.

Likewise, the GUI 134 includes a second region 148 in which various settings of power supply 126 are displayed. For example, within the second region 148, the GUI 134 generated by the communication module 104 includes a first sub-region 150 in which the output voltage of the power supply 126 is displayed, particularly with a value up to two decimal values. The second region 148 also includes a second sub-region 152 in which the output current of the power supply 126 is displayed, a third sub-region 154 in which an indication of whether the power supply 126 is currently paralleled is displayed, and a fourth sub-region 156 in which the load ratio for the power supply 126 is displayed. The second region 148 also includes a selectable GUI element 158 that, when selected by the user, triggers the GUI 134 to enable the user to manually adjust the output voltage of the power supply 126 up to two decimal values.

In addition, the GUI 134 includes a third region 160 in which the total load current is displayed.

By providing the GUI 134, the system 100 provides the ability for a user to precisely trim voltage in real time while seeing the impact these changes make to the resultant current that each power supply provides. In addition, the system 100 can also facilitate a 50:50 load sharing by making it simpler through remote sensing, real time current monitoring, and remote trimming of the output voltage. Even if there are variances in power supply electronics, wire lengths, and wire gauges, the negative impact of such variances can be reduced or nullified by use of the remote user interface, thus, ensuring desired redundancy is achieved.

The architecture of the system 100 can also usefully facilitate hotswapping either a power supply or the communication module 104 without damaging the components of the system 100 or without disrupting the operation of the load system.

Figure 6:
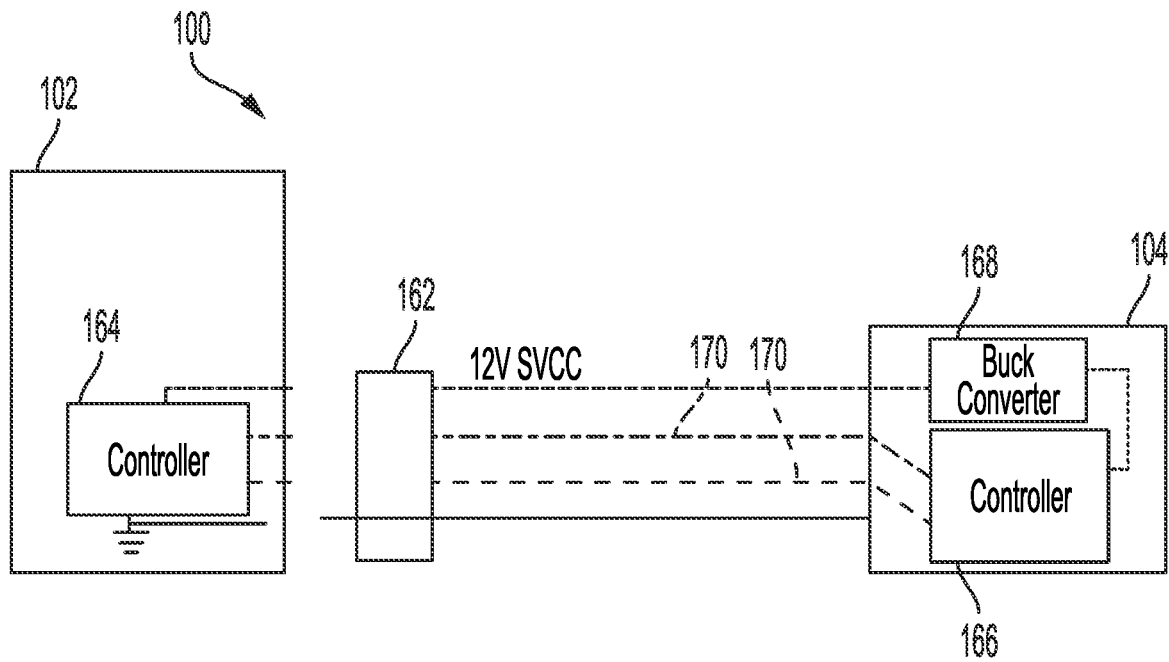
FIG. 6 depicts a power supply and communication module of the system of FIG. 1 with protection from hotswapping via use of a connector, according to an example implementation.

FIG. 6 depicts an example implementation of how to protect from hotswapping—namely, via the system 100 including a cable connector 162 between the power supply 102 and the communication module 104.

To appreciate the advantages of the cable connector 162, consider first a situation in which a 12-volt SVCC is being used to energize control circuitry on the power supply 102 and the communication module 104, and in which the cable connector 162 is not present. If a cable that connects the power supply 102 and the communication module 104 is connected or disconnected, there is a chance that the 12-volt SVCC will damage a controller 164 (e.g., the processor 110 and memory 112) of power supply 102 if a ground return pin was the last pin to have electrical contact in the cable. The 12-volt SVCC will have an unimpeded path from the power supply 102, going to the communication module 104, passing through a controller 166 (e.g., the processor 116 and memory 118) of the communication module 104 and a buck converter 168 of the communication module 104), through data lines 170 between the power supply 102 and the communication module 104, and finally to the pins of the controller of the power supply 102. This can cause damage to the power supply 102 if the controller does not have the ability to protect against 12-volt electrical overstress.

Accordingly, the cable connector 162 can help ensure that the ground return pin will always be the first one to electrically connect and the last one to electrically disconnect whenever the user connects the communication module 104 to the power supply 102. That is, the cable connector 162 is configured such that, based on the power supply 102 being connected to the communication module 104, a ground return path is established between the power supply 102 and the communication module 104 before other power or signal connections are made between the power supply 102 and the communication module 104. And the cable connector 162 is further configured such that, based on the power supply 102 being disconnected from the communication module 104, the ground return path remains in place until all other power or signal connections are disconnected between the power supply 102 and the communication module 104. This can be achieved due to the ground return path being a metal shield or other shielding in the cable connector 162, or due to the ground return path being is longer than the rest of the pins in the header.

Figure 7:
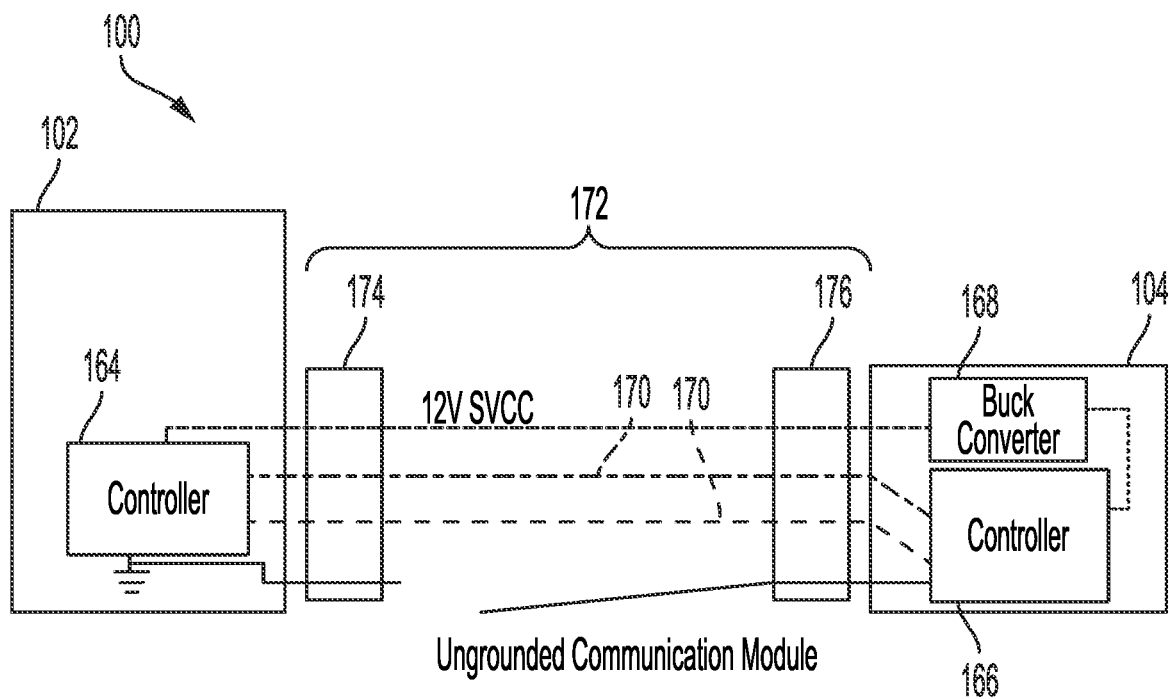
FIG. 7 depicts a power supply and communication module of the system of FIG. 1 with protection from hotswapping via use of an isolation buffer, according to an example implementation.

FIG. 7 depicts another example implementation of how to protect from hotswapping—namely, via the system 100 including a pair of isolation buffers 172 coupled between the power supply 102 and the communication module 104.

In particular, the pair of isolation buffers 172 includes a first isolation buffer 174 coupled to the power supply 102 and a second isolation buffer 176 coupled to the communication module 104. Further, the pair of isolation buffers 172 are coupled to each other as well. The first isolation buffer 174 can be configured to isolate electrical connections between the power supply 102 and the communication module 104 until a ground return pin of the power supply 102 is connected, and the second isolation buffer 176 can be configured to isolate electrical connections between the power supply 102 and the communication module 104 until a ground return pin of the communication module 104 is connected.

The pair of isolation buffers 172 can enable the safe level connections to reach the power supply controller only when all the electrical connections are satisfied through additional logic enabling or disabling the pair of isolation buffers 172. If a cable is already inserted into the communication module 104 and will be inserted to the power supply 102, then the first isolation buffer 174 can perform the isolation and protection. Whereas, if a cable is already inserted into the power supply 102 and will be inserted to the communication module 104, then the second isolation buffer 176 can perform the isolation and protection. In practice, some buffers implement logic that automatically allows electrical signals through only in response to detecting that all four connections are established, and other buffers are enabled or disabled via a separate logic pin that can be programmed as a designer sees fit. Further, even if the ground return path is not yet connected, the 12-volt SVCC will not overstress the power supply controller pins because the pair of isolation buffers 172 effectively isolates all of the 4 electrical connections until the ground return pin is connected.

Figure 8:
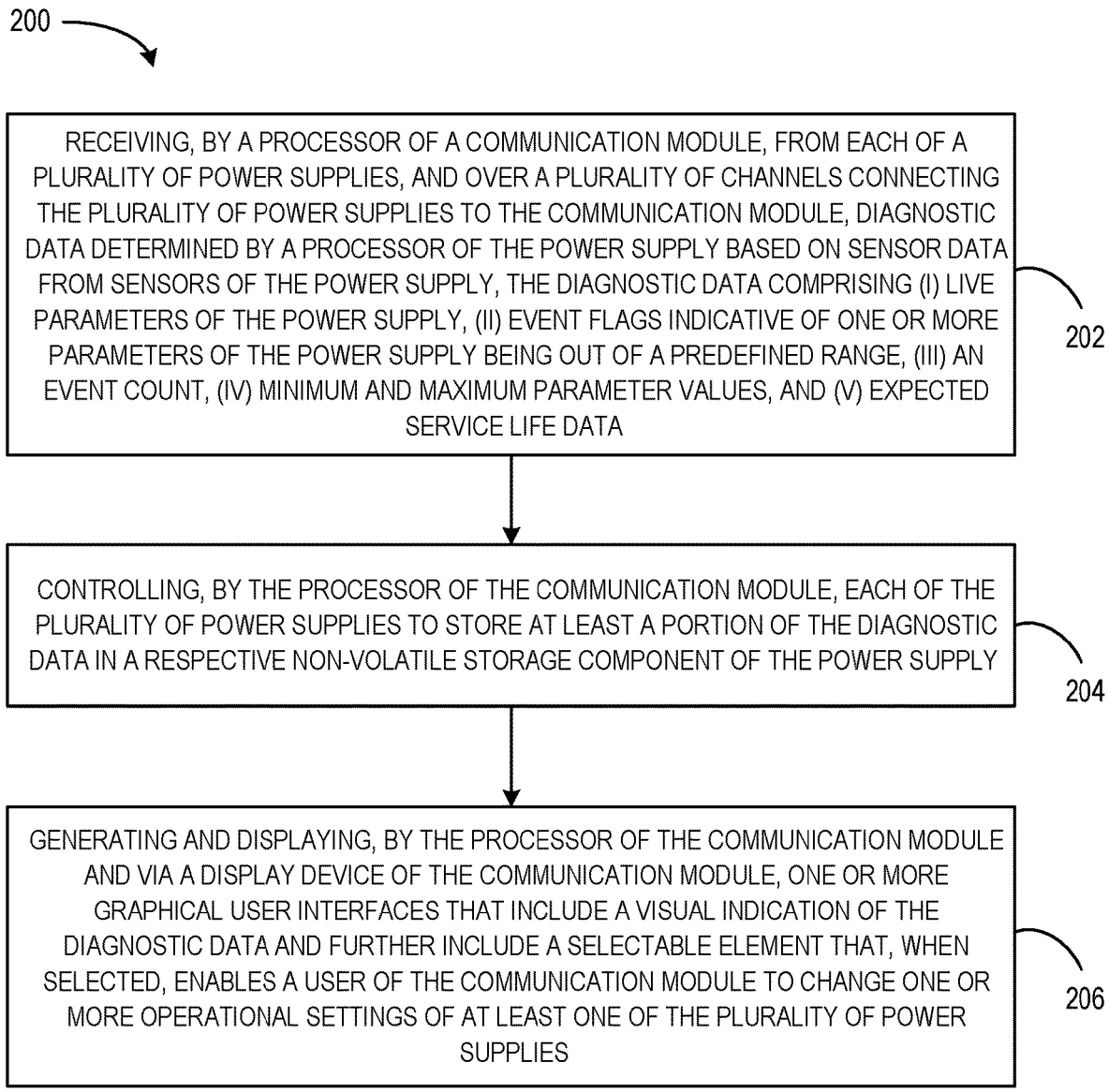
FIG. 8 depicts a flowchart of a method, according to an example implementation.

FIG. 8 depicts a flowchart of a method 200. Method 200 shown in FIG. 8 presents an example of a method that could be used with the system 100 described herein, or with components thereof. Further, devices or systems may be used or configured to perform logical functions presented in FIG. 8. Method 200 may include one or more operations, functions, or actions as illustrated by one or more of blocks 202-206. Although the blocks are illustrated in a sequential order, these blocks may also be performed in parallel, and/or in a different order than those described herein. Also, the various blocks may be combined into fewer blocks, divided into additional blocks, and/or removed based upon the desired implementation.

For this and other processes and methods disclosed herein, flowcharts show functionality and operation of one possible implementation of present examples. Each block or portions of each block may represent a module, a segment, or a portion of program code, which includes one or more instructions executable by a processor for implementing specific logical functions or steps in the process. The program code may be stored on any type of computer readable medium or data storage, for example, such as a storage device including a disk or hard drive. Further, the program code can be encoded on a computer-readable storage media in a machine-readable format, or on other non-transitory media or articles of manufacture. The computer readable medium may include non-transitory computer readable medium or memory, for example, such as computer-readable media that stores data for short periods of time like register memory, processor cache and Random Access Memory (RAM). The computer readable medium may also include non-transitory media, such as secondary or persistent long-term storage, like read only memory (ROM), optical or magnetic disks, compact-disc read only memory (CD-ROM), for example. The computer readable media may also be any other volatile or non-volatile storage systems. The computer readable medium may be considered a tangible computer readable storage medium, for example.

In addition, each block or portions of each block in FIG. 8, and within other processes and methods disclosed herein, may represent circuitry that is wired to perform the specific logical functions in the process. For example, a microcontroller unit, special-purpose processor, analog control circuitry, or the like can be used to carry out the blocks described in relation to method 200. Alternative implementations are included within the scope of the examples of the present disclosure in which functions may be executed out of order from that shown or discussed, including substantially concurrent or in reverse order, depending on the functionality involved, as would be understood by those reasonably skilled in the art.

At block 202, the method 200 includes receiving, by a processor of a communication module, from each of a plurality of power supplies, and over a plurality of channels connecting the plurality of power supplies to the communication module, diagnostic data determined by a processor of the power supply based on sensor data from sensors of the power supply, the diagnostic data comprising (i) live parameters of the power supply, (ii) event flags indicative of one or more parameters of the power supply being out of a predefined range, (iii) an event count, (iv) minimum and maximum parameter values, and (v) expected service life data;

At block 204, the method 200 includes controlling, by the processor of the communication module, each of the plurality of power supplies to store at least a portion of the diagnostic data in a respective non-volatile storage component of the power supply; and At block 206, the method 200 includes generating and displaying, by the processor of the communication module and via a display device of the communication module, one or more graphical user interfaces that include a visual indication of the diagnostic data and further include a selectable element that, when selected, enables a user of the communication module to change one or more operational settings of at least one of the plurality of power supplies.

Within examples, the method 200 can include one or more of the other operations described herein as being performed by the processor 116 of the communication module 104.

The particular arrangements shown in the figures should not be viewed as limiting. It should be understood that other embodiments can include more or less of each element shown in a given figure. Further, some of the illustrated elements can be combined or omitted. Yet further, an example embodiment can include elements that are not illustrated in the figures.

While various aspects and embodiments have been disclosed herein, other aspects and embodiments will be apparent to those skilled in the art. The various aspects and embodiments disclosed herein are for purpose of illustration and are not intended to be limiting, with the true scope being indicated by the following claims.

What is claimed is:

1. A system comprising:
   two or more power supplies;
   a control system communicatively coupled to the two or more power supplies;
   a communication module configured to communicate with a host network according to an ethernet-based protocol; and
   channels connecting the two or more power supplies to the communication module, wherein the channels are configured to support communication between the two or more power supplies and the communication module according to a serial communication protocol,
   wherein:
      the communication module is configured to interface with the two or more power supplies via the channels, and
      each power supply of the two or more power supplies is configured to transmit diagnostic data associated with the power supply to the communication module via a respective channel of the channels,
      wherein the communication module is configured to generate and display a graphical user interface that includes a visual indication of the diagnostic data and further includes a selectable element that, when selected, causes a change of an operational setting of a power supply of the two or more power supplies.

2. The system of claim 1, wherein:
   the system further comprises a redundancy module connected between the control system and the two or more power supplies.

3. The system of claim 1, wherein the diagnostic data comprises two or more of live parameters, event flags, event counts, minimum and maximum parameter values, or expected service life data.

4. The system of claim 1, wherein:
   each power supply of the two or more power supplies comprises non-volatile memory,
   the diagnostic data comprises event flags indicative of one or more parameters of the power supply being out of a predefined range,
   the one or more parameters comprise one or more of an electrical characteristic of the power supply or a temperature characteristic of the power supply, and
   the communication module is configured to (i) determine that the power supply is shutting down and (ii) in response to the determination that the power supply is shutting down, cause the power supply to record the event flags in the non-volatile memory.

5. The system of claim 1, wherein:
   each power supply of the two or more power supplies comprises non-volatile memory,
   the diagnostic data comprises event counts and minimum and maximum parameter values, and
   the power supply is configured to (i) determine that the power supply is shutting down and (ii) in response to the determination that the power supply is shutting down, record the event counts and minimum and maximum parameter values in the non-volatile memory.

6. The system of claim 1, further comprising:
   a cable connector connected between a particular power supply of the two or more power supplies and the communication module and configured such that (i) based on the particular power supply being connected to the communication module, a ground return path is established between the particular power supply and the communication module before other power or signal connections are made between the particular power supply and the communication module and (ii) based on the particular power supply being disconnected from the communication module, the ground return path remains in place until all other power or signal connections are disconnected between the particular power supply and the communication module.

7. The system of claim 1, wherein:
the communication module comprises a display device and is configured to generate and output, via the display device, a graphical user interface (GUI) comprising visual indications of at least a portion of the diagnostic data.

8. The system of claim 7, wherein:
the communication module comprises an input device configured to receive user input identifying (i) a portion of the diagnostic data, (ii) a threshold, and (iii) an instruction to monitor the portion of the diagnostic data relative to the threshold, and
the communication module is configured to output an alert based on the instruction.

9. The system of claim 1, wherein:
the communication module comprises an input device configured to receive user input identifying a first instruction to change one or more settings of the two or more power supplies,
the communication module is configured to transmit a second instruction to the two or more power supplies to change the one or more settings, in response to receiving the user input identifying the first instruction, and
the two or more power supplies are configured to change the one or more settings in response to receiving the second instruction.

10. The system of claim 9, wherein:
the one or more settings comprise one or more of a current output, an over current pending, or an over current enabled.

11. The system of claim 9, wherein:
the one or more settings comprise one or more of an over temperature pending or an over temperature enabled.

12. The system of claim 9, wherein:
the one or more settings comprise an output voltage, and
the communication module is configured to enable the output voltage to be adjusted up to a second decimal value.

13. The system of claim 1, wherein:
the serial communication protocol is an inter-integrated circuit (I2C) protocol.

14. The system of claim 1, wherein:
the serial communication protocol is a universal asynchronous receiver-transmitter (UART) protocol.

15. The system of claim 1, wherein:
the serial communication protocol is a serial peripheral interface (SPI) protocol.

16. The system of claim 1, wherein:
the control system comprises a distributed control system or a programmable logic controller.

17. The system of claim 1, wherein the channels are I2C channels.

18. A system comprising:
two or more power supplies;
a control system communicatively coupled to the two or more power supplies;
a communication module; and
channels connecting the two or more power supplies to the communication module and configured to support communication according to a particular communication protocol,
wherein:
the communication module is configured to interface with the two or more power supplies via the channels, and
each power supply of the two or more power supplies is configured to transmit diagnostic data associated with the power supply to the communication module via a respective channel of the channels, the system further comprising:
a pair of isolation buffers coupled between a particular power supply of the two or more power supplies and the communication module, wherein:
the pair of isolation buffers comprises a first isolation buffer coupled to the particular power supply and a second isolation buffer coupled to the communication module,
the first isolation buffer is configured to isolate electrical connections between the particular power supply and the communication module until a ground return pin of the particular power supply is connected, and
the second isolation buffer is configured to isolate electrical connections between the particular power supply and the communication module until a ground return pin of the communication module is connected.

19. A method comprising:
receiving, by a processor of a communication module via a serial communication protocol, from each power supply of a plurality of power supplies, and over a plurality of channels connecting the plurality of power supplies to the communication module, diagnostic data determined by a processor of the power supply based on sensor data from sensors of the power supply, the diagnostic data comprising (i) live parameters of the power supply, (ii) event flags indicative of one or more parameters of the power supply being out of a predefined range, (iii) an event count, (iv) minimum and maximum parameter values, and (v) expected service life data;
controlling, by the processor of the communication module, each of the plurality of power supplies to store at least a portion of the diagnostic data in a respective non-volatile storage component of the power supply;
generating and displaying, by the processor of the communication module and via a display device of the communication module, one or more graphical user interfaces that include a visual indication of the diagnostic data and further include a selectable element that, when selected, enables a user of the communication module to change one or more operational settings of at least one of the plurality of power supplies; and
sending, by the communication module, the diagnostic data to a host network via an ethernet-based protocol.

* * * * *